United States Patent
Handa

(10) Patent No.: US 7,403,437 B2
(45) Date of Patent: Jul. 22, 2008

(54) ROM TEST METHOD AND ROM TEST CIRCUIT

(75) Inventor: Kenichi Handa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 111 days.

(21) Appl. No.: 11/107,873

(22) Filed: Apr. 18, 2005

(65) Prior Publication Data

US 2006/0002207 A1 Jan. 5, 2006

(30) Foreign Application Priority Data

Jul. 2, 2004 (JP) ............................. 2004-196183

(51) Int. Cl.
*G11C 7/00* (2006.01)
(52) U.S. Cl. .............. 365/201; 365/189.03; 365/189.12
(58) Field of Classification Search ................. 365/201, 365/189.03, 189.12
See application file for complete search history.

(56) References Cited

U.S. PATENT DOCUMENTS

| | | | | |
|---|---|---|---|---|
| 5,048,019 A | * | 9/1991 | Albertsen | 714/718 |
| 5,164,918 A | * | 11/1992 | Ogino et al. | 365/201 |
| 6,065,142 A | * | 5/2000 | Ban | 714/18 |
| 6,081,908 A | * | 6/2000 | Yamada | 714/30 |
| 6,389,564 B1 | * | 5/2002 | Lu | 714/718 |
| 6,917,215 B2 | * | 7/2005 | Ichikawa | 324/765 |
| 7,136,771 B2 | * | 11/2006 | Terauchi | 702/117 |

FOREIGN PATENT DOCUMENTS

| | | |
|---|---|---|
| JP | 2-298877 | 12/1990 |
| JP | 6-052697 | 2/1994 |
| JP | 8-184645 | 7/1996 |

OTHER PUBLICATIONS

Official Notice of Reason for Rejection mailed Jul. 25, 2007 in Japanese Patent Application No. 2004-196183 filed Jul. 2, 2004.

* cited by examiner

*Primary Examiner*—Richard T. Elms
*Assistant Examiner*—Hien N Nguyen
(74) *Attorney, Agent, or Firm*—Studebaker & Brackett PC; Donald R. Studebaker

(57) ABSTRACT

The present invention provides a ROM test circuit capable of shortening a test time and a test method therefor. When data written into a plurality of ROMs are tested, data of the ROM (1) and ROM(2) are selected based on the output data of the specific ROM(3). Then, the selected data are compared with expected values to thereby perform testing thereof. Therefore, the contents of the ROM(3) are also tested within the time required to test each of the ROM(1) and ROM(2), thus making it possible to shorten a test time.

8 Claims, 6 Drawing Sheets

Prior Art

ROM TEST METHOD AND ROM TEST CIRCUIT

BACKGROUND OF THE INVENTION

1. Field of the Invention

The present invention relates to a method for testing a Read Only Memory (hereinafter called "ROM") and a test circuit therefor.

2. Description of the Related Art

FIG. 5 is a circuit diagram showing one example of a conventional ROM test method. FIG. 6 is a time chart showing a procedure for testing ROMs using a circuit shown in FIG. 5. In the conventional example, CS_1 corresponding to a chip select signal for a ROM1 and OE_1 for enabling an output gate are first made effective. All address spaces of the ROM1 are accessed and data thereof are outputted to their corresponding terminals and then compared with expected values, whereby the ROM1 is checked. Thereafter, a similar test was repeated to carry out tests on a ROM2 and a ROM3.

A patent document 1 (see Japanese Unexamined Patent Publication No. Hei 8(1996)-184645) discloses another test method wherein in a semiconductor integrated circuit with a plurality of ROMs built therein, data read from a plurality of ROM blocks corresponding to address data inputted thereto are subjected to addition or subtraction respectively, and the results thereof are outputted to output terminals via buffers and compared with expected values, thereby checking for ROM data.

In the conventional test method shown in FIGS. 5 and 6, however, a test time increases in proportion to the number of the mounted ROMs, thus leading to an increase in manufacturing cost. Since the method described in the patent document 1 is a method of performing addition or subtraction on the data outputted from the plurality of ROMs and checking the results thereof against the expected values, the result of addition or subtraction might coincide with the expected value even when an error occurs in some of the data. Therefore, the present method was accompanied by a drawback that the error in ROM data could not be checked properly.

SUMMARY OF THE INVENTION

The present invention has been made in view of the foregoing. It is therefore an object of the present invention to provide a ROM test method for testing data written into a plurality of ROMs, wherein the outputs of other ROM data intended for testing are selected based on output data of a specific ROM to thereby test the corresponding ROM.

Since the present invention provides a method for confirming other ROM data intended for testing, based on data of a specific ROM in a plurality of ROMs intended for testing, the data of the specific ROM is also confirmed within the time required to confirm other ROM data intended for testing, whereby a test time is shortened correspondingly.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a ROM test method and a ROM test circuit therefor according to the present invention will hereinafter be described in detail with reference to the accompanying drawings.

First Preferred Embodiment

Figure 1:
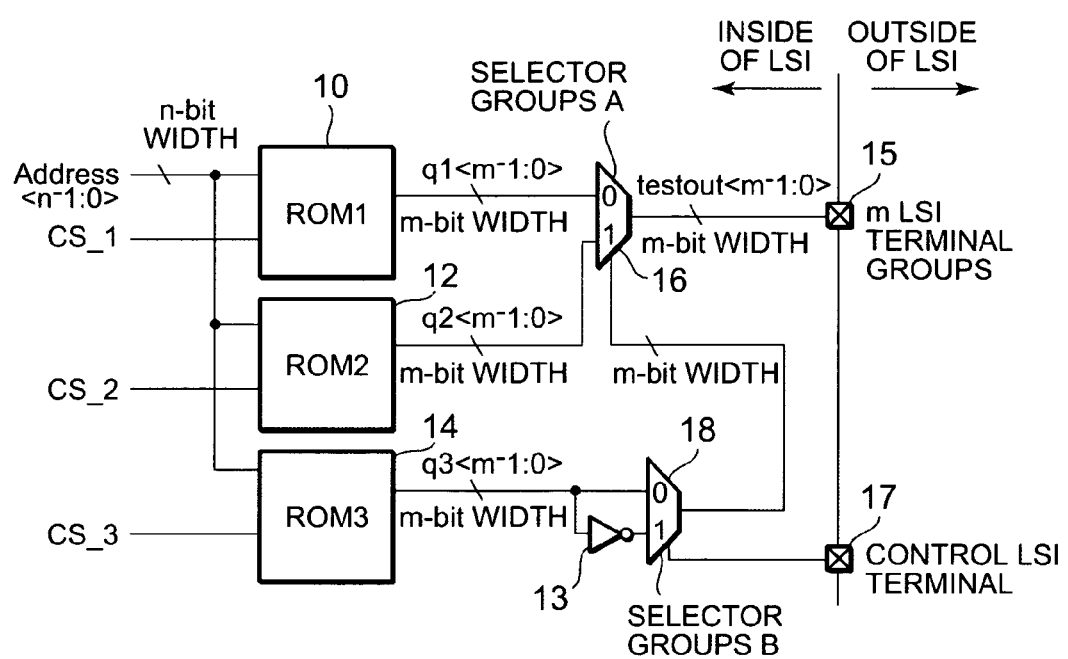
FIG. 1 is a block diagram showing a configuration of a ROM test circuit according to a first embodiment of the present invention.
Figure 2:
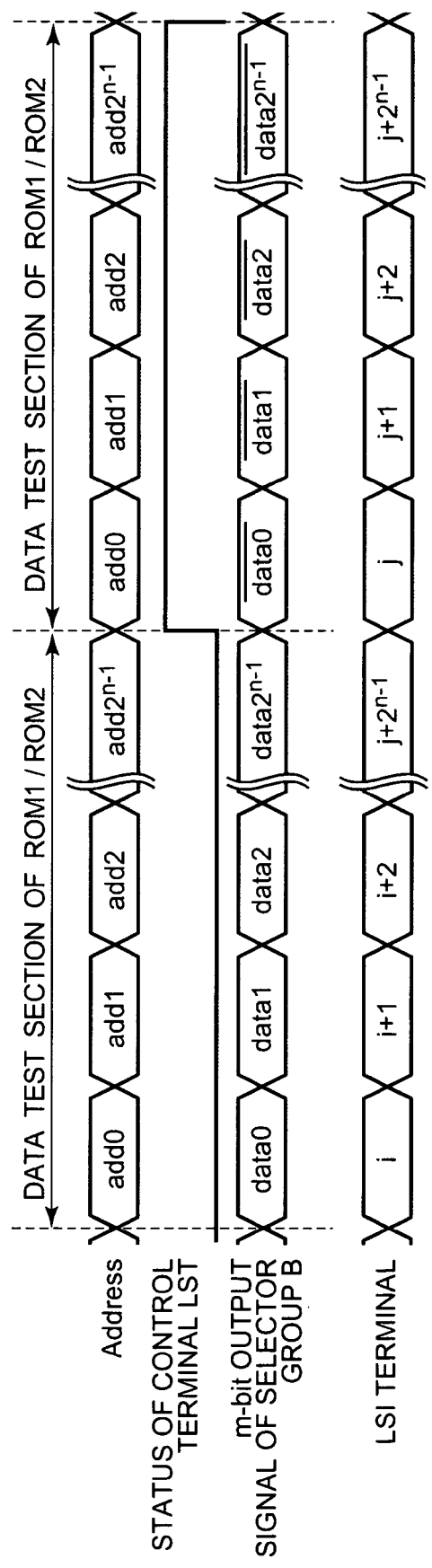
FIG. 2 is a time chart illustrating the operation of the ROM test circuit of FIG. 1 at the time of a ROM test using the ROM test circuit.

FIG. 1 is a block diagram showing a configuration of a ROM test circuit according to a first embodiment of the present invention. FIG. 2 is a time chart at the time of a ROM test using the ROM test circuit shown in FIG. 1.

Output data having m bit widths, of a ROM1 (10) and a ROM2 (12) are connected to their corresponding "0" sides or "1" sides of m selector groups A (16). Non-inverted output data having an m bit width, of a ROM3 (14) is connected to its corresponding "0" side of each of m selector groups B. The non-inverted output data supplied via each of m inverter groups 13 is connected to its corresponding "1" side of each of the same m selector groups B. A control signal for each of the selector groups B is supplied from its corresponding control LSI terminal 17. m-bit outputs of the m selector groups B are connected as control signals corresponding to respective bits of the m selector groups A. m-bit outputs of the m selector groups A are connected to their corresponding m LSI terminals 15.

The operation of the ROM test circuit having the above configuration is as follows. That is, when a signal having a "0" level is first inputted from the control LSI terminal, data on the "0" side is selected in each selector group B and hence non-inverted data of the ROM3 is selected. This data is connected as a control signal for each selector group A. When addresses corresponding to all address spaces of the ROMs are inputted to an address terminal commonly connected to the respective ROMs in this condition, data on the "0" sides (output data of ROM1) or the "1" sides (output data of ROM2) connected to the selector groups A are selected according to the output data of the ROM3 and outputted to the LSI terminal groups respectively. Then, each of the data is compared with an expected value of the ROM1 or an expected value of the ROM2 according to the control signal of the corresponding selector group A. Incidentally, chip select signals CS_1 through CS_3 for the respective ROMs may be made effective during a test period.

Next, a similar test is repeated with the control signal sent from the control LSI terminal as "1". In this case, inverted data of the ROM3 is selected as the output of each selector group B. Since this data is inputted as the control signal for the selector group A, data of the ROM1 or ROM2 corresponding to each address which has not been selected upon the previous test, is outputted via the corresponding selector group A and compared with an expected value in like manner.

According to the test method using the test circuit as described above, the data of the ROM1 and ROM2 are selected and confirmed depending on the data of the ROM3. Thus, the data of the ROM3 is also confirmed within the time required to confirm the data of the ROM1 and ROM2, thereby making it possible to shorten a test time and reduce the manufacturing cost of the test circuit.

Second Preferred Embodiment

Figure 3:
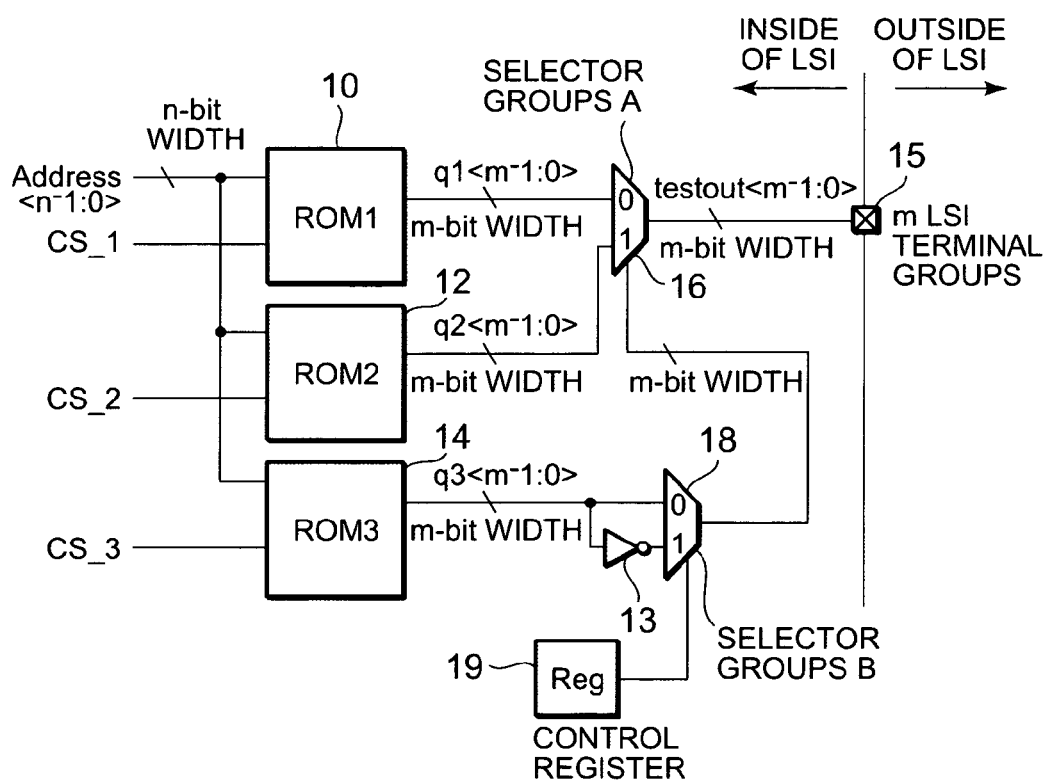
FIG. 3 is a block diagram showing a configuration of a ROM test circuit according to a second embodiment of the present invention.
Figure 4:
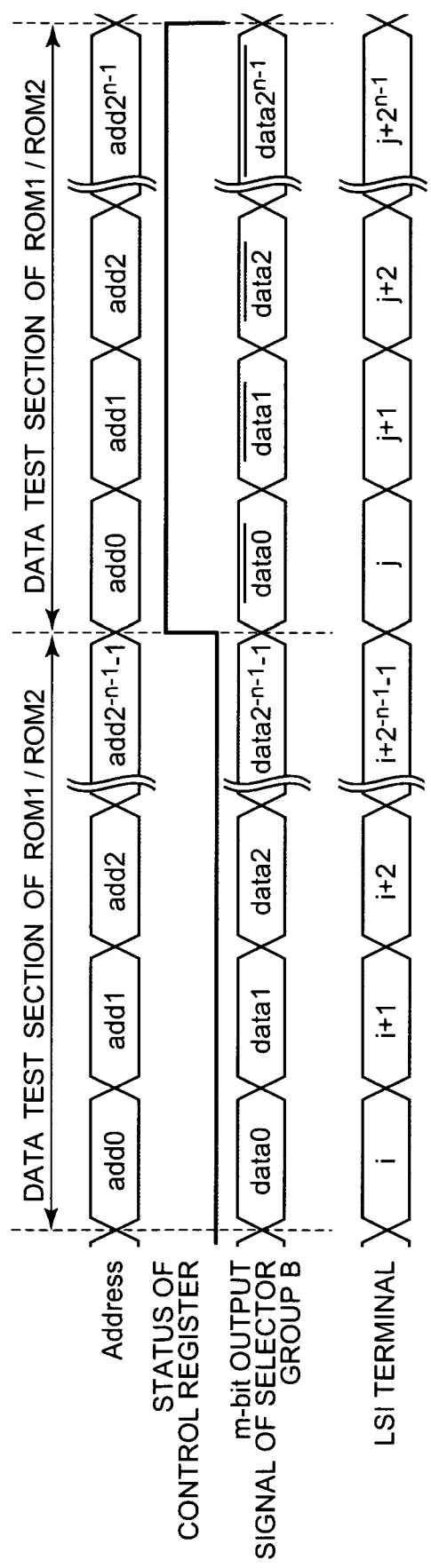
FIG. 4 is a time chart illustrating the operation of the ROM test circuit shown in FIG. 3 at the time of a ROM test using the ROM test circuit.
Figure 5:
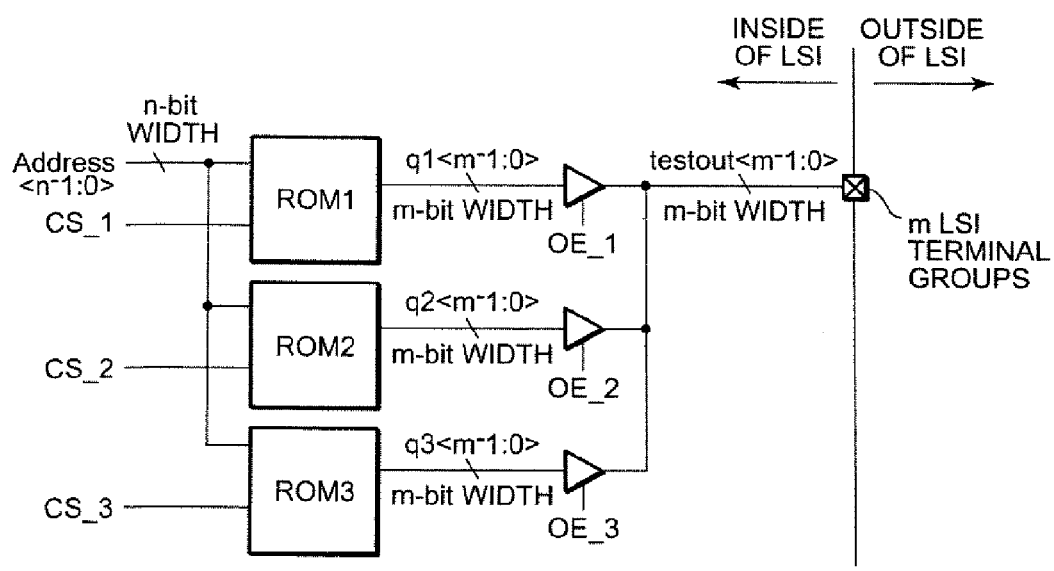
FIG. 5 is a block diagram showing a configuration of a conventional ROM test circuit.
Figure 6:
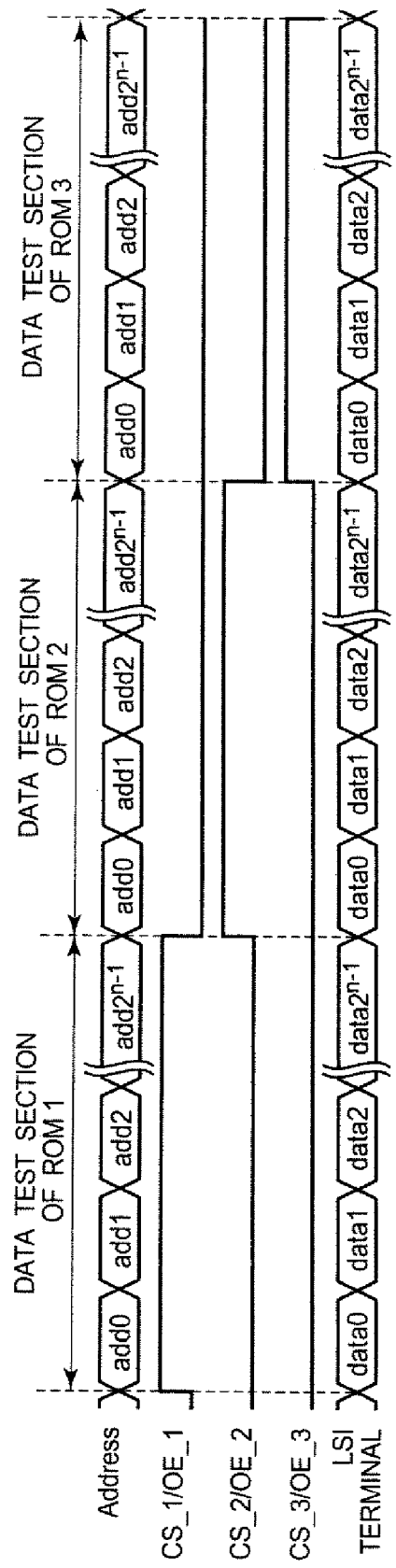
FIG. 6 is a time chart illustrating the operation of the conventional ROM test circuit.

FIG. 3 is a block diagram showing a configuration of a ROM test circuit according to a second embodiment of the present invention. FIG. 4 is a time chart showing the operation of the ROM test circuit shown in FIG. 3 at the time of a ROM test using the ROM test circuit.

The second embodiment is different from the first embodiment in that a control register 19 is used as an alternative to the input of the control signal to each selector group B from outside. The present embodiment is configured in such a manner that a signal outputted from the control register 19 is outputted with being switched to "0" or "1" as an alternative to the input of the control signals "0" and "1" from outside. The present embodiment is similar to the first embodiment in other components and basic operation.

In addition to the effect obtained in the first embodiment, the second embodiment has also an advantageous effect in that the number of terminals necessary for interface with the outside can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A memory test circuit for testing data written into a plurality of memories, comprising:
    first selecting means for selecting output data of a predetermined memory and inverted data thereof; and
    second selecting means for selecting output data of other memories intended for testing,
    wherein the output data from the first selecting means is used as a select control signal for the second selecting means.

2. The memory test circuit according to claim 1, wherein a control signal for selecting data inputted to the first selecting means is a control signal inputted from outside.

3. The memory test circuit according to claim 1, wherein a control signal for selecting data inputted to the first selecting means is a signal outputted from an internal control register.

4. A memory test circuit comprising:
    a first memory circuit which stores a plurality of data and outputs the stored data;
    a second memory circuit which stores a plurality of data and outputs the stored data;
    a third memory circuit which stores a plurality of data and outputs the stored data;
    a first selector which receives the output data of the first memory circuit and outputs a first select control signal; and
    a second selector which receives the output data of the second and third memory circuits and outputs the output data of the second and third memory circuits in response to the first select control signal.

5. A memory test circuit according to claim 4, where the first through third memory circuits are arranged in a single chip.

6. The memory test circuit according to claim 5, wherein the first selector receives a control signal inputted from outside of the chip.

7. The memory test circuit according to claim 5 further comprising a control register which outputs a control signal to the first selector for selecting an operation of the first selector.

8. The memory test circuit according to claim 4, wherein the first through third memory circuit receives a common address signal.

\* \* \* \* \*